(12) United States Patent
Fujiwara et al.

(10) Patent No.: US 8,501,592 B2
(45) Date of Patent: Aug. 6, 2013

(54) FREESTANDING III-NITRIDE SINGLE-CRYSTAL SUBSTRATE AND METHOD OF MANUFACTURING SEMICONDUCTOR DEVICE UTILIZING THE SUBSTRATE

(75) Inventors: Shinsuke Fujiwara, Itami (JP); Seiji Nakahata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 129 days.

(21) Appl. No.: 13/006,429

(22) Filed: Jan. 14, 2011

(65) Prior Publication Data

US 2012/0070962 A1      Mar. 22, 2012

Related U.S. Application Data

(63) Continuation of application No. 12/426,963, filed on Apr. 21, 2009, now abandoned.

(30) Foreign Application Priority Data

Apr. 25, 2008  (JP) ................................. 2008-115013
Dec. 22, 2008  (JP) ................................. 2008-326384

(51) Int. Cl.
  *H01L 21/20*      (2006.01)
(52) U.S. Cl.
  USPC ........ 438/478; 438/46; 438/483; 257/E21.09; 257/E33.003; 117/63
(58) Field of Classification Search
  USPC ............. 257/615, E21.09, E21.097, E21.108, 257/E21.117, E33.025, E33.003
  See application file for complete search history.

(56) References Cited

U.S. PATENT DOCUMENTS

| 8,310,030 B2 * | 11/2012 | Hirota et al. ................ 257/615 |
| 2002/0115267 A1 * | 8/2002 | Tomiya et al. ............... 438/478 |
| 2005/0103257 A1 * | 5/2005 | Xu et al. ........................ 117/84 |
| 2005/0161697 A1 | 7/2005 | Nakahata et al. |
| 2005/0164419 A1 * | 7/2005 | Hirota et al. .................. 438/46 |

FOREIGN PATENT DOCUMENTS

| CN | 1405903 A | 3/2003 |
| CN | 1894446 A | 1/2007 |
| EP | 1731632 A2 | 12/2006 |
| JP | 2003-133649 A | 5/2003 |
| JP | 2006-315947 A | 11/2006 |
| JP | 2007-519591 A | 7/2007 |
| JP | 2007-254258 A | 10/2007 |
| JP | 2008-037665 A | 2/2008 |
| WO | WO-2007-125914 A1 | 11/2007 |

* cited by examiner

*Primary Examiner* — Calvin Lee
*Assistant Examiner* — Scott Stowe
(74) *Attorney, Agent, or Firm* — James W. Judge

(57) ABSTRACT

Freestanding III-nitride single-crystal substrates whose average dislocation density is not greater than $5\times10^5$ cm$^{-2}$ and that are fracture resistant, and a method of manufacturing semiconductor devices utilizing such freestanding III-nitride single-crystal substrates are made available. The freestanding III-nitride single-crystal substrate includes one or more high-dislocation-density regions (20h), and a plurality of low-dislocation-density regions (20k) in which the dislocation density is lower than that of the high-dislocation-density regions (20h), wherein the average dislocation density is not greater than $5\times10^5$ cm$^{-2}$. Herein, the ratio of the dislocation density of the high-dislocation-density region(s) (20h) to the average dislocation density is sufficiently large to check the propagation of cracks in the substrate. And the semiconductor device manufacturing method utilizes the freestanding III-nitride single crystal substrate (20p).

22 Claims, 10 Drawing Sheets

FREESTANDING III-NITRIDE SINGLE-CRYSTAL SUBSTRATE AND METHOD OF MANUFACTURING SEMICONDUCTOR DEVICE UTILIZING THE SUBSTRATE

BACKGROUND OF THE INVENTION

1. Technical Field

The present invention relates to freestanding III-nitride single-crystal substrates that are of low average dislocation density and are fracture resistant, and to methods of manufacturing semiconductor devices utilizing the substrates.

2. Description of the Related Art

III-nitride single-crystal substrates whose dislocation-density distribution is uniform and whose average dislocation density is low are being developed as freestanding III-nitride single-crystal substrates ideally suited to application in semiconductor devices including light-emitting devices and electronic devices.

In Japanese Unexamined Pat. App. Pub. No. 2004-193371 (Patent Document 1), for example, a freestanding substrate incorporating a III-nitride semiconductor layer of less than $1\times10^6$ cm$^{-2}$ average dislocation density is disclosed—specifically, a GaN film (freestanding substrate) in which the dislocation density varies within a 0.12 to $1.5\times10^6$ cm$^{-2}$ range. In Japanese Unexamined Pat. App. Pub. No. 2006-52102 (Patent Document 2), meanwhile, a III-V Group nitride system semiconductor substrate whose average dislocation density is $5\times10^7$ cm$^{-2}$ or less is disclosed—specifically a GaN freestanding substrate having a dislocation-density range of $1.4\pm0.7\times10^6$ cm$^{-2}$.

Nonetheless, freestanding III-nitride single-crystal substrates of still lower dislocation density are being sought as substrates for semiconductor devices, in order to improve semiconductor device properties further.

Patent Document 1: Japanese Unexamined Pat. App. Pub. No. 2004-193371

Patent Document 2: Japanese Unexamined Pat. App. Pub. No. 2006-52102

Accordingly, the manufacture of freestanding III-nitride single-crystal substrates of still lower dislocation density—for example, of $5\times10^5$ cm$^{-2}$ average dislocation density—has been attempted. With, at an average dislocation density of $5\times10^5$ cm$^{-2}$, ultra-low density freestanding III-nitride single-crystal substrates, however, those whose dislocation-density distribution is uniform have been discovered to be fracture-prone.

BRIEF SUMMARY OF THE INVENTION

Therein, an object of the present invention is to resolve the problems just discussed by making available freestanding III-nitride single-crystal substrates whose average dislocation density is not greater than $5\times10^5$ cm$^{-2}$ and that are fracture resistant, and to make available a method of manufacturing semiconductor devices utilizing such freestanding III-nitride single-crystal substrates.

The present invention is a freestanding III-nitride single-crystal substrate in which the average dislocation density is not greater than $5\times10^5$ cm$^{-2}$, and that includes one or more high-dislocation-density regions, and a plurality of low-dislocation-density regions in which the dislocation density is lower than that of the high-dislocation-density regions.

In a freestanding III-nitride single-crystal substrate involving the present invention, the ratio of the dislocation density of the high-dislocation-density region(s) to the average dislocation density is sufficiently large to check the propagation of cracks in the substrate. For example, it is possible to have the ratio of the dislocation density of the high dislocation density region(s) to the average dislocation density be 2 or greater. It is also possible to have the dislocation density of the high-dislocation-density region(s) be between $5\times10^5$ cm$^{-2}$ and $3\times10^6$ cm$^{-2}$. Likewise, it is possible to have the dislocation density of the low-dislocation-density regions be not greater than $1\times10^5$ cm$^{-2}$.

Furthermore, a freestanding III-nitride single-crystal substrate involving the present invention may be one having a hexagonal crystal-system structure, and in which any chosen {1$\bar{1}$00} plane in the substrate intersects the one or more high-dislocation-density regions. Herein, the one or more high-dislocation-density regions can be patterned in a geometry, seen from the major surface of the substrate, that includes any of striped patterns, polygonally checkered patterns, periodically arrayed islet patterns, or nonrepetitive patterns.

Still further, in a freestanding III-nitride single-crystal substrate involving the present invention, it is possible to have the surface area of the major surface be 20 cm$^2$ or greater, and to have the thickness be 1000 μm or less. It is also possible to have the freestanding III-nitride single-crystal substrate be a GaN single-crystal freestanding substrate. Yet further, the freestanding III-nitride single-crystal substrate can be formed by HVPE.

The present invention is also a method of manufacturing a semiconductor device utilizing a freestanding III-nitride single-crystal substrate as set forth above.

The present invention enables the provision of freestanding III-nitride single-crystal substrates that have an average dislocation density of not greater than $5\times10^5$ cm$^{-2}$ and which are fracture resistant, and the invention can make available a method of manufacturing semiconductor devices utilizing such freestanding III-nitride single-crystal substrates.

BRIEF DESCRIPTION OF THE SEVERAL VIEWS OF THE DRAWINGS

FIG. 3 is outline sectional diagrams for illustrating one example of a method, involving the present invention, of manufacturing a freestanding III-nitride single-crystal substrate, wherein: FIG. 3A represents a process step of preparing a starting substrate; FIG. 3B represents a process step of growing III-nitride crystal onto the starting substrate by liquid-phase deposition; FIG. 3C represents a process step of growing single-crystal III-nitride onto the III-nitride crystal by vapor-phase deposition; and FIG. 3D represents a formed freestanding III-nitride single-crystal substrate.

FIG. 5 is a sectional diagram summarily illustrating another example of a method, involving the present invention, of manufacturing a freestanding III-nitride single-crystal substrate, wherein.

DETAILED DESCRIPTION OF THE INVENTION

Figure 1:
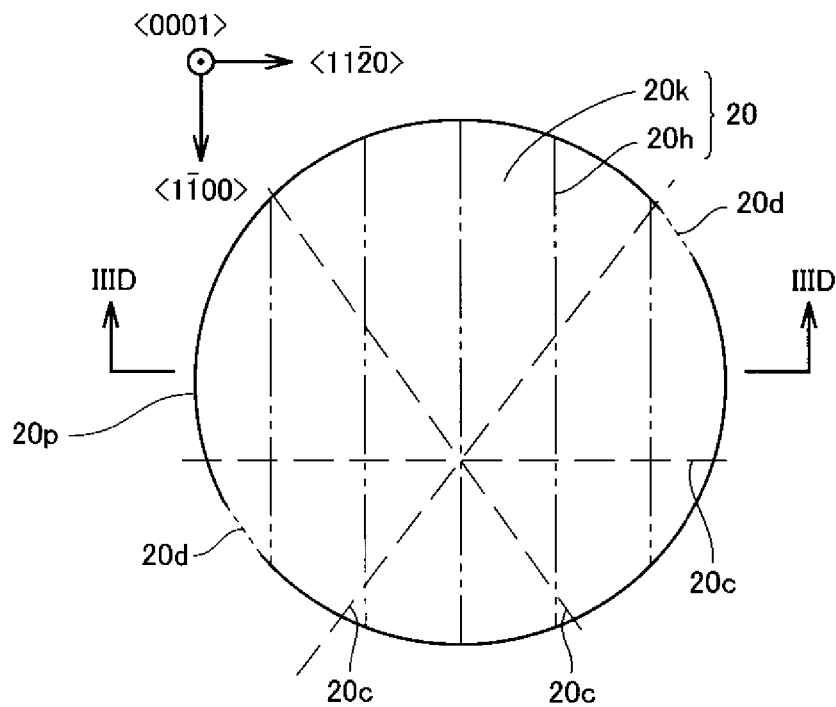
FIG. 1 is a plan view summarily representing one example of a freestanding III-nitride single-crystal substrate involving the present invention.

Embodying Mode 1
Freestanding III-Nitride Single-Crystal Substrate

Reference is made to FIGS. 1, 2, 7 and 8: With a freestanding III-nitride single-crystal substrate 20$p$ that is one mode of embodying the present invention, the average dislocation density is $5\times10^5$ cm$^{-2}$ or less. The dislocation density in the substrate is found by measuring the density of dark spots under cathodoluminescence (CL), or by etching the substrate and measuring the density of etch-pits thereby produced in its major surface. In the present embodying mode, the dislocation density of the substrate is found from dark-spot density measurements by CL. Herein, "average dislocation density" means the average density of dark spots measured by CL globally across the substrate major surface (that is, across the entire major surface of later-described high-dislocation-density regions and low-dislocation-density regions).

A further characteristic of the present freestanding III-nitride single-crystal substrate 20$p$ is that it includes one or more high-dislocation-density regions 20$h$, and a plurality of low-dislocation-density regions 20$k$ where the dislocation density is lower than that of the high-dislocation-density regions 20$h$. The fact that the present freestanding III-nitride single-crystal substrate 20$p$ includes the high-dislocation-density regions 20$h$ and low-dislocation-density regions 20$k$, makes it possible to arrest the propagation of cracks arising in the substrate, making it possible to prevent fracturing of the substrate.

In particular, with the present freestanding III-nitride single-crystal substrate 20$p$, the ratio of the dislocation density of the high-dislocation-density region(s) 20$h$ to the dislocation density of the low-dislocation-density regions 20$k$ is sufficiently large to check the propagation of cracks in the substrate, and thus the ratio of the dislocation density of the high-dislocation-density region(s) 20$h$ to the average dislocation density is sufficiently large to check the propagation of cracks in the substrate. By having the dislocation-density distribution in the substrate be non-uniform, to make the ratio of the dislocation density of the high-dislocation-density region(s) 20$h$ to the average dislocation density sufficiently large, the propagation of cracks arising in the substrate can be arrested, enabling fracturing of the substrate to be prevented.

Herein, in respect of the ratio of the dislocation density of the high-dislocation-density region(s) 20$h$ to the average dislocation density, the size sufficient to arrest the propagation of cracks will differ depending on the crystalline structure and chemical composition of the substrate. With freestanding III-nitride single crystal substrates in which the substrate is of the hexagonal crystal system—for example, GaN single-crystal freestanding substrates, AlN single-crystal freestanding substrates, InN single-crystal freestanding substrates, Al$_x$Ga$_{1-x}$N ($0<x<1$) single-crystal freestanding substrates, and In$_y$Ga$_{1-y}$N ($0<y<1$) single-crystal freestanding substrates—the ratio of the dislocation density of the high-dislocation-density region(s) 20$h$ to the average dislocation density is preferably 2 or greater, more preferably 5 or greater, still more preferably 10 or greater. "Dislocation density of the high-dislocation-density region(s) 20$h$" herein means the average density of dark spots quantified by the CL method over the major surface of the high-dislocation-density region(s).

The present freestanding III-nitride single-crystal substrate 20$p$, furthermore, is not particularly limited, so long as the average dislocation density is $5\times10^5$ cm$^{-2}$ or less and the ratio of the dislocation density of the high-dislocation-density region(s) 20$h$ to the average dislocation density is sufficiently large to check the propagation of cracks in the substrate, but from the perspective of managing both to prevent fracturing of the substrate and to prevent detriment to the properties of semiconductor devices obtained by forming an at least single-lamina III-nitride semiconductor layer onto the substrate, the dislocation density of the high-dislocation-density region(s) 20$h$ preferably is between $5\times10^5$ cm$^{-2}$ and $3\times10^6$ cm$^{-2}$, more preferably between $5\times10^5$ cm$^{-2}$ and $2\times10^6$ cm$^{-2}$, still more preferably between $5\times10^5$ cm$^{-2}$ and $1\times10^6$ cm$^{-2}$. And from the perspective of reducing the dislocation density of the low-dislocation-density regions 20$k$ to reduce the average dislocation density, the dislocation density of the low-dislocation-density regions 20$k$ is preferably $1\times10^5$ cm$^{-2}$ or less, more preferably $1\times10^4$ cm$^{-2}$ or less, still more preferably $1\times10^3$ cm$^{-2}$ or less. "Dislocation density of the low-dislocation-density region(s) 20$k$" herein means the average density of dark spots quantified by the CL method over the major surface of the low-dislocation-density regions 20$k$.

Reference is again made to FIGS. 1, 2, 7 and 8: It is preferable that the present freestanding III-nitride single-crystal substrate 20$p$ have a hexagonal crystal-system structure, and that any chosen $\{1\bar{1}00\}$ plane 20$c$ in the substrate intersect the one or more high-dislocation-density regions 20$h$. A freestanding III-nitride single crystal substrate having a hexagonal crystal-system structure has as the cleavage planes, which are most liable to fracture, the $\{1\bar{1}00\}$ planes 20$c$. Thus, on account of the $\{1\bar{1}00\}$ planes 20$c$ intersecting the one or more high-dislocation-density regions 20h, the propagation of cracks along the {1$\bar{1}$00} planes 20c is arrested. Fracturing of the substrate can thereby be efficiently prevented.

The reason herein is: Supposing, for example with reference to FIG. 1, that any chosen {1$\bar{1}$00} plane 20c does not include a {1$\bar{1}$00} plane 20d that is present only on the peripheral edge of the substrate. It could be that such a {1$\bar{1}$00} plane 20d does not intersect the high-dislocation-density region(s) 20h. Nevertheless, even if there is a {1$\bar{1}$00} plane 20d that is present only on the peripheral edge of the substrate, it will not be a problem, in that it will not lead to the substrate thereby fracturing.

With reference yet again to FIGS. 1, 2, 7 and 8, the one or more high-dislocation-density regions 20h in the present freestanding III-nitride single-crystal substrate 20p are patterned in a geometry, seen from the major surface of the substrate, that preferably includes any of striped patterns (cf. FIG. 1), polygonally checkered patterns (cf. FIG. 2), periodically arrayed islet patterns (cf. FIG. 7), or nonrepetitive patterns (cf. FIG. 8). That the one or more high-dislocation-density regions 20h are patterned in a geometry, seen from the major surface of the substrate, that includes any of striped patterns (cf. FIG. 1), polygonally checkered patterns (cf. FIG. 2), periodically arrayed islet patterns (cf. FIG. 7), or nonrepetitive patterns (cf. FIG. 8) makes it so that the {1$\bar{1}$00} planes 20c can intersect even more of the high-dislocation-density regions 20h, thanks to which fracturing of the substrate can be more efficiently prevented.

Figure 2:
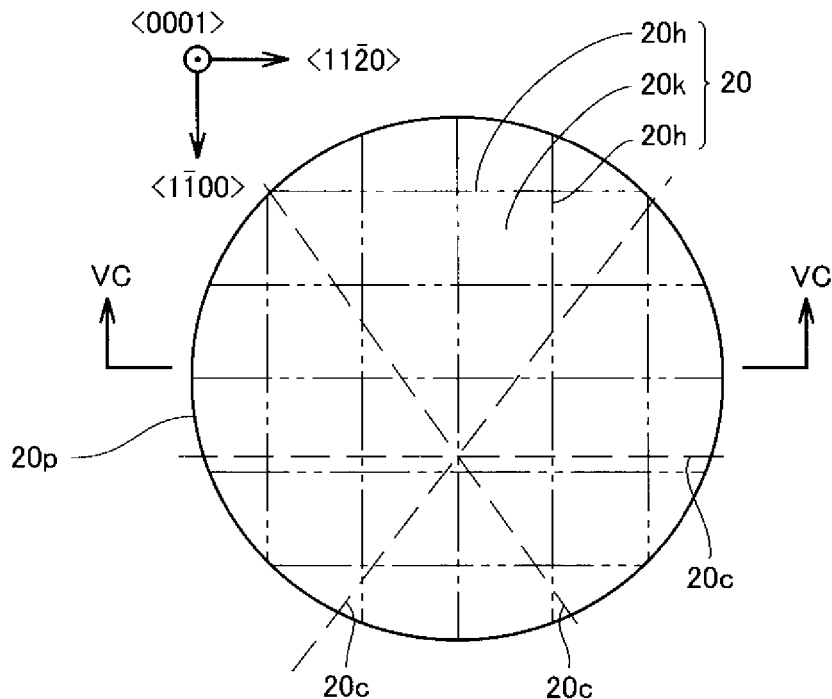
FIG. 2 is a plan view summarily representing another example of a freestanding III-nitride single-crystal substrate involving the present invention.
Figure 7:
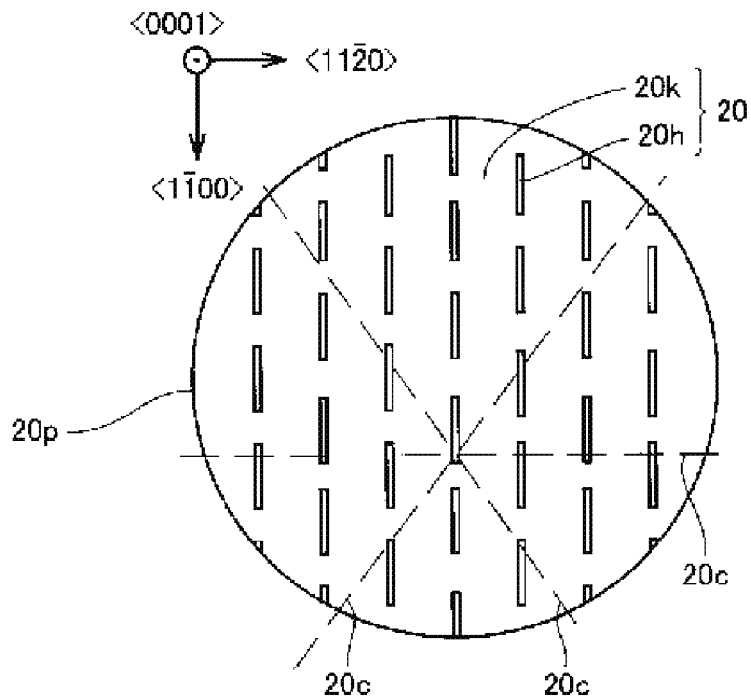
FIG. 7 is a plan view summarily representing another example of a freestanding III-nitride single-crystal substrate involving the present invention.
Figure 8:
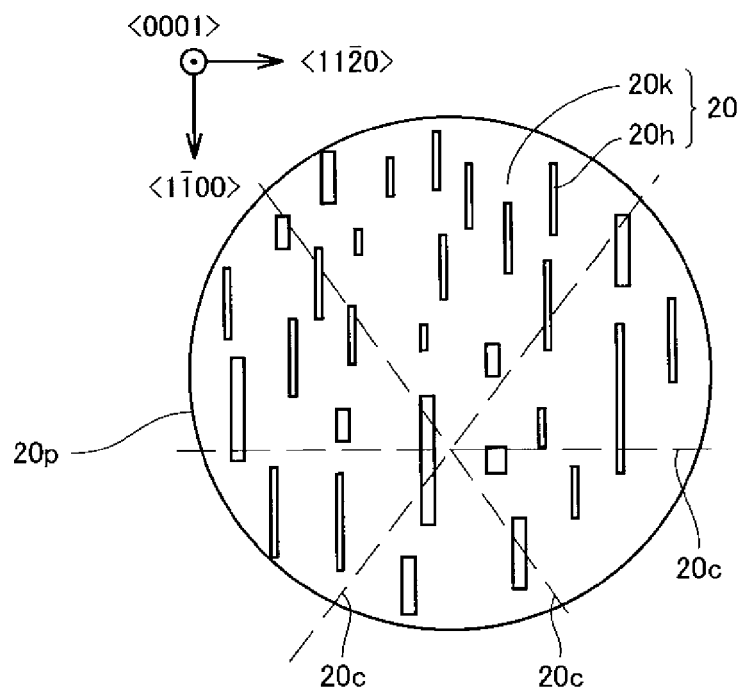
FIG. 8 is a plan view summarily representing still another example of a freestanding III-nitride single-crystal substrate involving the present invention.

Herein, in FIG. 2, an instance in which the polygonally checkered pattern is a square-check pattern is registered, but the polygonal form constituting the polygonally checkered pattern may be, other than square, triangular, rectangular, rhomboid, parallelogrammic, trapezoidal, hexagonal, etc. Likewise, it is sufficient for the periodically arrayed islet pattern form or nonrepetitive pattern form, as depicted in FIG. 7 and FIG. 8, of the high-dislocation-density regions 20h, to be geometries whereby any chosen {1$\bar{1}$00} plane 20c intersects the one or more high-dislocation-density regions 20h; the high-dislocation-density regions 20h do not have to be continuous, and the positional relationships between each high-dislocation-density region 20h separate from another are not limited to the positional relationships depicted in FIG. 7 or FIG. 8.

Freestanding III-Nitride Single Crystal Substrate Manufacturing Methods

While the method of manufacturing a freestanding III-nitride single crystal substrate of the present embodying mode is not particularly limited, the following two manufacturing methods are given as examples.

First Manufacturing Method

Figure 3:
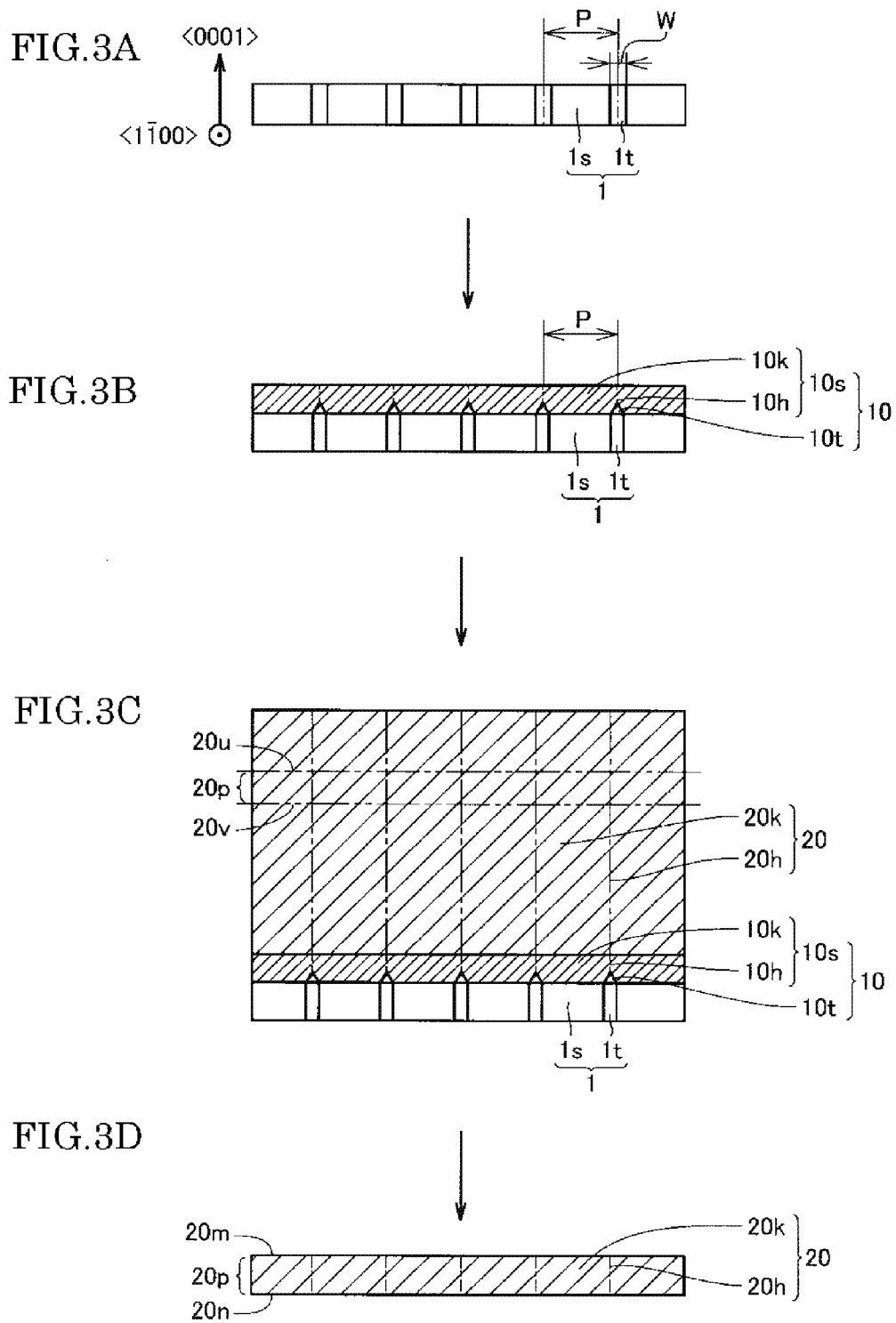
Figure 4:
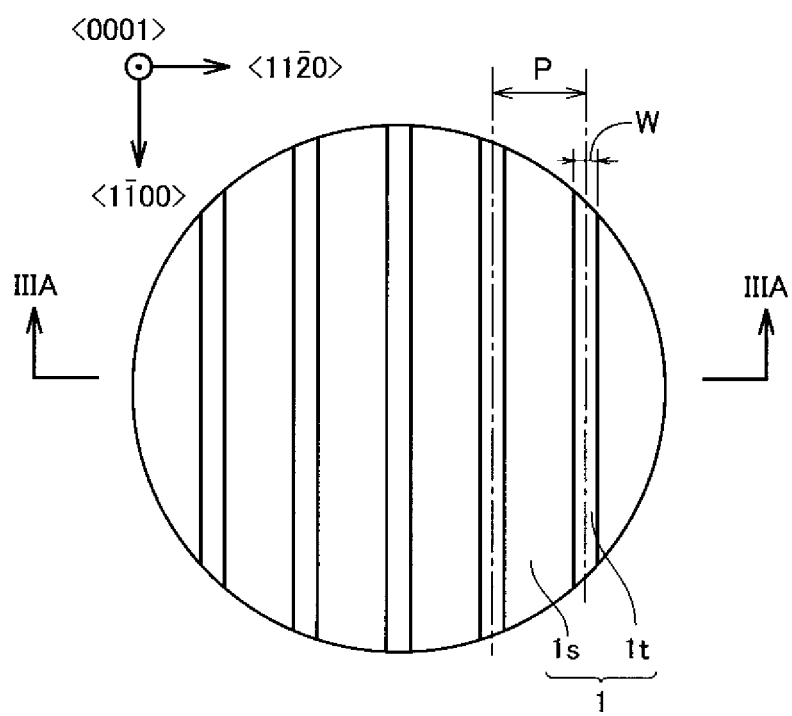
FIG. 4 is a plan view summarily representing one example of a starting substrate employed in the manufacture of a freestanding III-nitride single-crystal substrate involving the present invention.

With reference to FIGS. 3 and 4, the first manufacturing method includes: a step (FIG. 3A and FIG. 4) of preparing a starting substrate 1 constituted by III-nitride crystal having matrices 1s, and inversion domains 1t in which the polarity in the <0001> directions is inverted with respect to that of the matrices 1s; a step (FIG. 3B) of growing III-nitride crystal 10 by liquid-phase deposition onto the matrices 1s and inversion domains 1t in the starting substrate 1; a step (FIG. 3C) of growing III-nitride single crystal 20 by vapor-phase deposition onto the III-nitride crystal 10; and a step (FIGS. 3C and 3D) of processing the III-nitride single crystal 20 to form a freestanding III-nitride single crystal substrate 20p. Herein, FIG. 3A is an outline section diagram along IIIA-IIIA in FIG. 4, while FIG. 3D is an outline section diagram along IIID-IIID in FIG. 1.

For the step of preparing the starting substrate 1, referring to FIG. 3A and FIG. 4, such a starting substrate 1 is manufactured by a facet-growth method based on hydride vapor-phase epitaxy (HVPE)—for example, as described in paragraphs [0221] through [0271] of Japanese Unexamined Pat. App. Pub. No. 2003-183100. The dislocation density of the matrices 1s of the starting substrate 1 will be low, while the dislocation density of the inversion domains 1t in the starting substrate 1 will, compared with that of the matrices 1s, be high.

In the step, referring to FIG. 3B, of growing the III-nitride crystal 10 by liquid-phase deposition, first zones 10s of the III-nitride crystal 10 grown onto the matrices 1s of the starting substrate 1 grow as crystal inheriting the polarity and low-density dislocations of the matrices 1s. Likewise, second zones 10t of the III-nitride crystal 10 grown onto the inversion domains 1t in the starting substrate 1 grow as crystal inheriting the polarity and high-density dislocations of the inversion domains 1t. Consequently, the <0001> oriented polarity of the second zones 10t of the III-nitride crystal 10 is inverted with respect to that of the first zones 10s, while the dislocation density is higher. Herein, the liquid-phase deposition method is not particularly limited, but from the perspective of epitaxially growing III-nitride crystal whose dislocation density is low, Na flux growth is preferred.

Yet the crystal growth rate in the first zones 10s is greater than the crystal growth rate in the second zones 10t. Therefore, as the III-nitride crystal 10 grows, the first zones 10s cover and bury over the second zones 10t. In this way growing the III-nitride crystal 10 leaves only the first zones 10s present at and over a certain crystal thickness, whereby at least the surface has a singular polarity. In the first zones 10s grown thus, low-dislocation-density regions 10k, where the crystal grows onto the matrices 1s of the starting substrate 1, and high-dislocation-density regions 10h, where the crystal grows onto the buried second zones 10t are included. Depending on the pitch P and width W dimensions of the inversion domains in the starting substrate 1, however, in some instances high-dislocation-density regions 10h will not be contained in the first zones 10s.

Herein, with reference to FIGS. 3A and 3B and FIG. 4, in order to produce high-dislocation-density regions 10h in the first zones 10s of the III-nitride crystal 10 grown by liquid-phase deposition, it is preferable to have the pitch P of the inversion domains 1t of the starting substrate 1 be 0.1 to 30 mm, and the width W thereof be 0.01 to 0.1 mm. By the same token, in order not to produce high-dislocation-density regions 10h in the first zones 10s of the III-nitride crystal 10 grown by liquid-phase deposition, it is preferable to have the pitch P of the inversion domains 1t of the starting substrate 1 be 0.01 to 0.1 mm, and the width W thereof be 0.0001 to 0.01 mm.

In the step, referring to FIG. 3C, of growing the III-nitride single crystal 20 by vapor-phase deposition, the III-nitride single crystal 20 grown onto the III-nitride crystal 10 includes low-dislocation-density regions 20k where the crystal grows onto the low-dislocation-density regions 10k in the first zones 10s of the III-nitride crystal 10, inheriting the zones' low-density dislocations, and high-dislocation-density regions 20h where the crystal grows onto the high-dislocation-density regions 10h in the first zones 10s of the III-nitride crystal 10, inheriting the zones' high-density dislocations. Herein, the vapor-phase deposition method is not particularly limited, but from the perspective of epitaxially growing crystal of high dislocation density at an advanced rate, HVPE (hydride vapor-phase epitaxy) is preferred.

In the step, referring to FIGS. 3C and 3D, of processing the III-nitride single crystal 20 to form a freestanding III-nitride single crystal substrate 20p, the III-nitride single crystal 20 grown by vapor-phase deposition is sliced along planes 20u and 20v parallel to the major surface of the starting substrate 1, after which the cut sides are polished to yield a freestanding III-nitride single crystal substrate 20p having major surfaces 20m and 20n. Herein, in order to render the freestanding III-nitride single crystal substrate 20p, the substrate thickness is preferably 100 µm or greater, more preferably 200 µm or greater, still more preferably 300 µm or greater.

Second Manufacturing Method

Figure 5A:
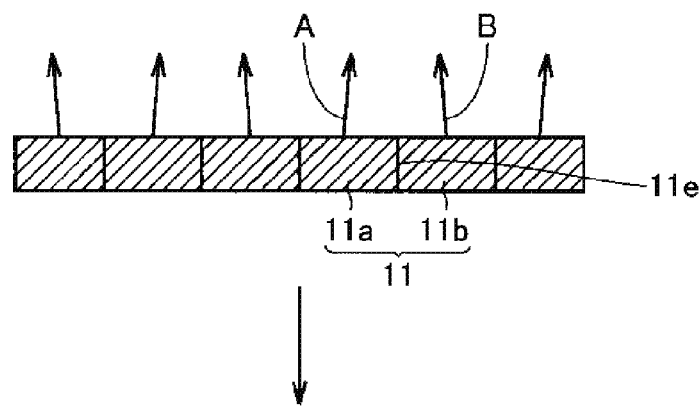
FIG. 5A represents a process step of forming an aggregate III-nitride crystal substrate.
Figure 5B:
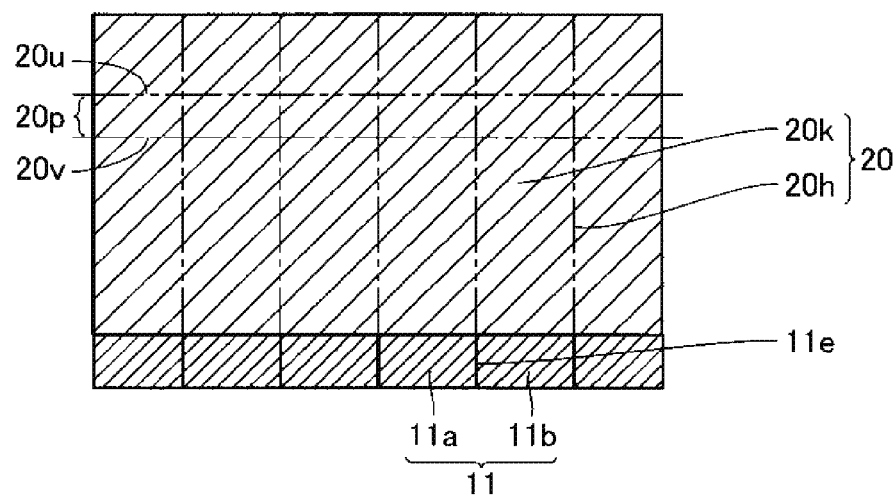
FIG. 5B represents a process step of growing single-crystal III-nitride onto the aggregate III-nitride crystal substrate by vapor-phase deposition.
Figure 5C:
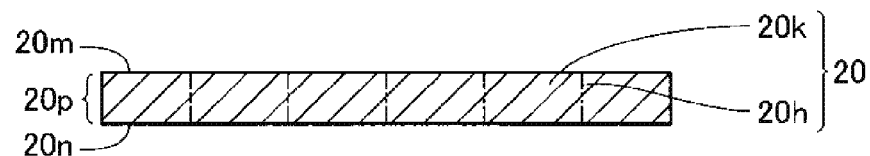
FIG. 5C represents a formed freestanding III-nitride single-crystal substrate.
Figure 6:
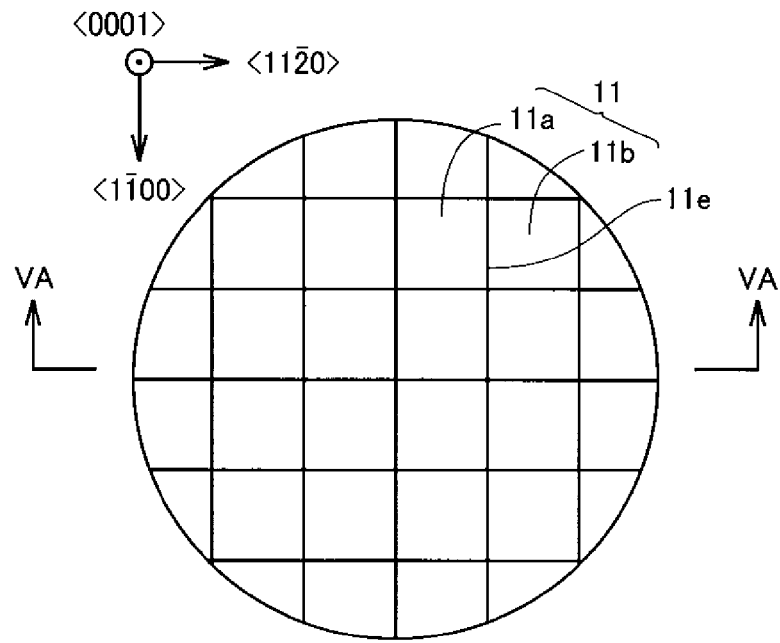
FIG. 6 is a plan view summarily representing one example of an aggregate III-nitride crystal substrate employed in the manufacture of a freestanding III-nitride single-crystal substrate involving the present invention.

With reference to FIGS. 5 and 6, the second manufacturing method includes: a step (FIGS. 5A and 6) of arranging a plurality of III-nitride crystal chip substrates 11a and 11b so that their major surfaces parallel each other, and so that their lateral sides adjoin each other, to form a III-nitride crystal aggregate substrate 11; a step (FIG. 5B) of growing III-nitride single crystal 20 by vapor-phase deposition onto the major surface of the III-nitride crystal aggregate substrate 11; and a step (FIGS. 5B and 5C) of processing the III-nitride single crystal 20 to form a freestanding III-nitride single crystal substrate 20p. Herein, FIG. 5A is an outline section diagram along VA-VA in FIG. 6, while FIG. 5C is an outline section diagram along VC-VC in FIG. 2.

Referring to FIGS. 5 and 6, the geometry of the major surfaces of the III-nitride crystal chip substrates 11a and 11b utilized in the step of forming the III-nitride crystal aggregate substrate 11 is not particularly limited, but from the viewpoint of tiling over, without gaps, any given planar surface, a triangular, quadrangular or hexagonal geometry is preferable, while an equilateral-triangular, square, rectangular, rhomboid, parallelogrammic, trapezoidal or regular-hexagonal geometry is more preferable.

In the present method, it is preferable that the plane orientations of the major surfaces of the plurality of III-nitride crystal chip substrates 11a and 11b be, from the standpoint of growing III-nitride single crystal 20 of superior crystallinity, identical or almost identical. On the other hand, in order to increase the dislocation density of the high-dislocation-density regions 20h that grow over the plane of contiguity 11e between the III-nitride crystal chip substrates 11a and 11b, to enhance the cracking-prevention effectiveness, the plane orientations of the major surfaces of the plural III-nitride crystal chip substrates 11a and 11b preferably are minutely displaced from each other. The direction of the plane-orientation displacement may be along a tilt line (direction slanted with respect to the c-axis of the III-nitride crystal) or may be along a twist line (direction skewed around the c-axis of the III-nitride crystal).

For the III-nitride crystal aggregate substrate 11 as a whole, however, because large displacement of the plane orientation of the major surfaces would be undesirable, the III-nitride crystal chip substrates 11a and 11b are more preferably arranged so that the directions of the plane-orientation displacement of the major surfaces of the adjoining III-nitride crystal chip substrates 11a and 11b will be such that the displacements cancel each other out. For example, referring to FIG. 5A, III-nitride crystal chip substrate 11a with major surface having plane orientation in direction A, and III-nitride crystal chip substrate 11b with major surface having plane orientation in direction B are disposed with the directions of the plane-orientation displacement of the major surfaces of the adjoining III-nitride crystal chip substrates 11a and 11b being such that the displacements cancel each other out.

In the step, referring to FIG. 5B, of growing the III-nitride single crystal 20 by vapor-phase deposition, the III-nitride single crystal 20 grown onto the III-nitride crystal aggregate substrate 11 includes low-dislocation-density regions 20k where the crystal grows onto the respective major surfaces of the III-nitride crystal chip substrates 11a and 11b of the III-nitride crystal aggregate substrate 11, and high-dislocation-density regions 20h where the crystal grows over the contiguity plane 11e between the III-nitride crystal chip substrates 11a and 11b where they adjoin each other. Herein, the vapor-phase deposition method is not particularly limited, but from the perspective of epitaxially growing crystal of high dislocation density at an advanced rate, HVPE (hydride vapor-phase epitaxy) is preferred.

In the step, referring to FIGS. 5B and 5C, of processing the III-nitride single crystal 20 to form a freestanding III-nitride single crystal substrate 20p, the III-nitride single crystal 20 grown by vapor-phase deposition is sliced along planes 20u and 20v parallel to the major surface of the III-nitride crystal aggregate substrate 11, after which the cut sides are polished to yield a freestanding III-nitride single crystal substrate 20p having major surfaces 20m and 20n. Herein, in order to render the freestanding III-nitride single crystal substrate 20p, the substrate thickness is preferably 100 µm or greater, more preferably 200 µm or greater, still more preferably 300 µm or greater.

Embodying Mode 2

Semiconductor Device Manufacturing Method

Reference is made to FIGS. 11 through 15: A semiconductor device 90 manufacturing method that is another mode of embodying the present invention is a method of manufacturing a semiconductor device 90 utilizing a freestanding III-nitride single crystal substrate 20p of Embodying Mode 1, and specifically is provided with a step of utilizing the freestanding III-nitride single crystal substrate 20p to prepare a semiconductor device substrate 90p, and step of forming an at least single-lamina III-nitride semiconductor layer 70 onto the semiconductor device substrate 90p.

In accordance with a semiconductor device manufacturing method in the present embodying mode, the semiconductor device substrate 90p prepared utilizing the freestanding III-nitride single crystal substrate 20p comprises III-nitride single crystal 20 in which the average dislocation density is not greater than $5 \times 10^5$ cm$^{-2}$, including one or more high-dislocation-density regions 20h and a plurality of low-dislocation-density regions 20k in which the dislocation density is lower than that of the high-dislocation-density region(s) 20h. Manufacture therefore without giving rise to fractures in the semiconductor device substrate 90p enables the production at high yield rates of semiconductor devices with superior device properties.

Semiconductor Device Substrate Preparation Step

Figure 11:
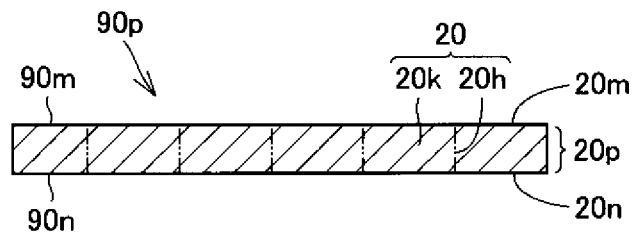
FIG. 11 is a sectional diagram summarily illustrating one example of a semiconductor device substrate prepared in a semiconductor device manufacturing method involving the present invention.

While the method of preparing the semiconductor device substrate 90p, referring to FIGS. 11 and 12, is not particularly limited as long as the substrate that is prepared comprises III-nitride single crystal 20, having one major surface 90m, of average dislocation density not greater than $5 \times 10^5$ cm$^{-2}$ and including one or more high-dislocation-density regions 20h and a plurality of low-dislocation-density regions 20k in which the dislocation density is lower than that of the high-dislocation-density region(s) 20h, the following method is given as an example.

For the semiconductor device substrate 90p, referring to FIG. 11, a freestanding III-nitride single crystal substrate 20p of Embodying Mode 1 may be prepared. While the method of preparing the freestanding III-nitride single crystal substrate 20p of Embodying Mode 1 is not particularly limited, the First Manufacturing Method or the Second Manufacturing Method in the freestanding III-nitride single crystal substrate manufacturing methods of Embodying Mode 1 can be utilized.

Alternatively, for the semiconductor device substrate 90p, referring to FIG. 12, a template substrate may be prepared in which are bonded a III-nitride single crystal 20q that is the product of thinning down to a film a freestanding III-nitride single crystal substrate 20p, and a heterosubstrate 90pb whose chemical composition differs from that of the III-nitride single crystal 20.

Figure 12A:
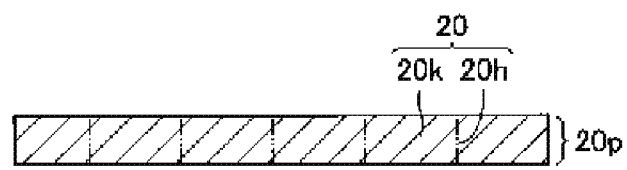
FIG. 12 is a sectional diagrams summarily illustrating another example of a semiconductor device substrate prepared in the semiconductor device manufacturing method involving the present invention.

With reference to FIG. 12, the afore-described template substrate can be prepared in the following way. To begin with, a freestanding III-nitride single crystal substrate 20p, referring to FIG. 12A, is prepared.

Figure 12B:
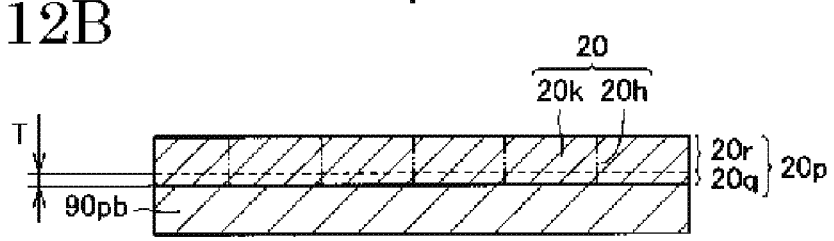

Next, referring to FIG. 12B, the heterosubstrate 90pb is bonded to the major surface of the freestanding III-nitride single crystal substrate 20p. Herein, the heterosubstrate 90pb is not particularly limited as long as it is a material capable of bonding with the freestanding III-nitride single crystal substrate 20p, and substrates having durability suited to the manufacture of the target semiconductor devices can be selected. Materials that may be cited given such considerations include: III-nitride substrates whose chemical composition differs from that of the III-nitride single crystal 20; sapphire substrates; SiC substrates; Si substrates; ZnSe substrates; ZnO substrates; ZnS substrates; MgO substrates; quartz substrates; carbon substrates; diamond substrates; $Ga_2O_3$ substrates; and ZrB substrates. And while the method of bonding the heterosubstrate 90pb is not particularly limited, from the perspective of enabling uniform bonding at low temperatures, methods such as surface-activated bonding and fusion bonding are preferable. Herein, "surface-activated bonding" means a technique whereby the surfaces to be bonded are bombarded with a plasma to superficially active them, and then the surfaces are joined together, while "fusion bonding" means a technique of applying pressure and heat to cleaned mating surfaces to be bonded, and joining the surfaces together.

Figure 12C:
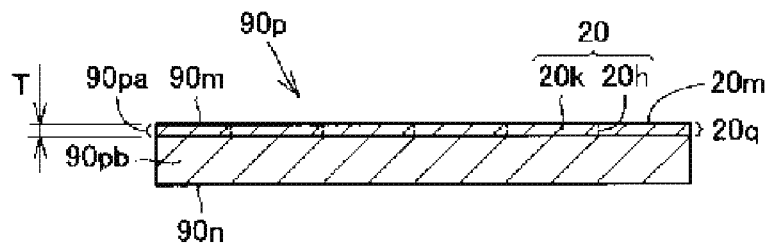

Next, referring to FIGS. 12B and 12C, the freestanding III-nitride single crystal substrate 20p is divided along a plane that is a predetermined distance T (for example, between 0.01 μm and 100 μm) from the single-crystal substrate's interface with the heterosubstrate 90pb. The method of dividing the freestanding III-nitride single crystal substrate 20p is not particularly limited, and methods employing devices such as electric-discharge machines, wire saws, dicing saws, internal diameter saws, and laser saws can be cited. Alternatively, while not illustrated in the figures, it is also possible to implant ions into a region of the freestanding III-nitride single crystal substrate that is alongside the surface that bonds the heterosubstrate and which has a predetermined depth T from that surface, thereafter bond on the heterosubstrate, and, by means of heat, force, etc., apply stress to the single-crystal substrate to divide it along the ion-implanted region. In that case, hydrogen ions, helium ions, etc. are employed as the implantation ions. Dividing the freestanding III-nitride single crystal substrate 20p, bonded to the heterosubstrate 90pb, along a plane at a predetermined distance T from its interface with the heterosubstrate 90pb removes remainder III-nitride single crystal substrate 20r from the freestanding III-nitride single crystal substrate 20p, to form a III-nitride single crystal layer 20q of thickness T, bonded to the heterosubstrate 90pb. In this way, as a semiconductor device substrate 90p, a template substrate including the heterosubstrate 90pb and, formed onto the heterosubstrate 90pb as a III-nitride seed crystal layer 90pa, the III-nitride single crystal layer 20q of thickness T is obtained.

Step of Forming Minimally Single-Lamina III-Nitride Semiconductor Layer

Figure 13:
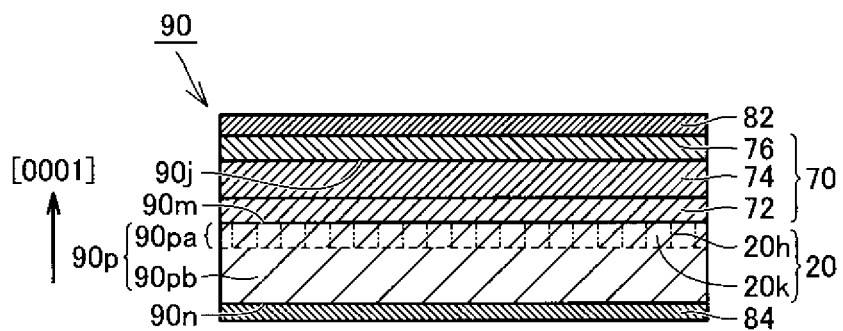
FIG. 13 is a sectional diagram summarily representing one example of a process step whereby semiconductor devices are obtained in a semiconductor device manufacturing method involving the present invention.

Reference is made to FIG. 13: Onto a one major surface 90m of the semiconductor device substrate 90p, an $n^+$-type GaN layer 72, an n-type GaN layer 74, and a p-type GaN layer 76, for example, are formed as an at least single-lamina III-nitride semiconductor layer 70. In this way a p-n junction plane 90j is formed in between the p-type GaN layer 76 and the n-type GaN layer 74. Herein, the one major surface 90m corresponds in the semiconductor device substrate 90p to the freestanding III-nitride single crystal substrate 20p (cf. FIG. 11), or to the major surface 20m of the III-nitride single crystal layer 20q. And while the method of forming the at least single-lamina III-nitride semiconductor layer 70 is not particularly limited, from the perspective of epitaxially growing low-dislocation-density, superior-crystallinity semiconductor layers, vapor deposition methods such as metalorganic chemical vapor deposition (MOCVD), hydride vapor-phase epitaxy (HVPE), molecular-beam epitaxy (MBE), and sublimation growth are preferably utilized.

Next, an Ni/Au laminate electrode is formed, as a p-side electrode 82, onto the p-type GaN layer 76 (with the Ni layer in contact with the p-type GaN layer), and a Ti/Al laminate electrode is formed, as an n-side electrode 84, onto the other major surface 90n of the semiconductor device substrate 90p (with the Ti layer in contact with the semiconductor device substrate 90p), yielding a semiconductor device 90. Herein, while the method of forming the p-side electrode 82 and n-side electrode 84 is not particularly limited, from a high productivity standpoint, such methods as evaporation deposition and sputter deposition are preferable.

Figure 14:
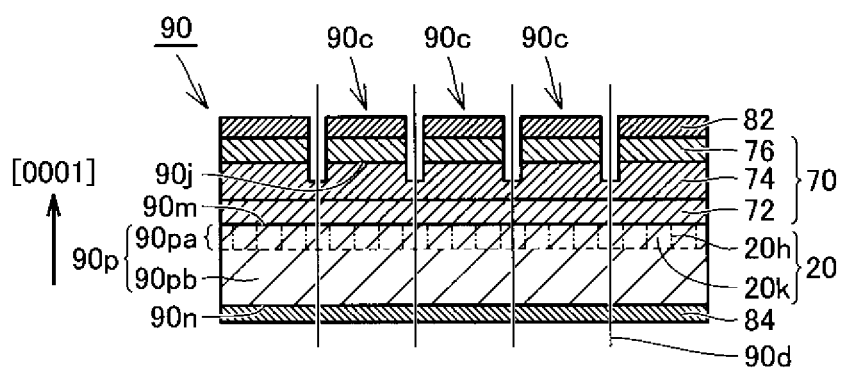
FIG. 14 is a sectional diagram summarily illustrating one example of a process step of segmenting the semiconductor devices into chips in the semiconductor device manufacturing method involving the present invention.

Further, referring to FIG. 14, the p-side electrode 82, p-type GaN layer 76, and a portion of the n-type GaN layer 74 are mesa-etched along dicing streets 90d in the just-described semiconductor device 90. Subsequently, by segmenting the semiconductor device 90 along the dicing streets 90d, semiconductor device chips 90c are obtained. By segmenting a single semiconductor device 90 into ten chips C1 through C10, for example, ten semiconductor device chips 90c are produced.

Embodiments

1. Manufacture of Freestanding GaN Single-Crystal Substrates (Freestanding III-Nitride Single Crystal Substrates)

In the present embodiment, freestanding GaN single crystal substrates (freestanding III-nitride single crystal substrates) were produced in the following manner, according to the above-described First Manufacturing Method.

1-1. Preparation of GaN Starting Substrates Having Matrices and Inversion Domains Reference is made to FIG. 3A and FIG. 4: 2-inch (5.08 cm) diameter, 350-μm thick starting substrates 1 of GaN crystal (termed GaN starting substrates 1 hereinafter) were prepared, having a plurality of matrices 1s in which the dislocation density was 0.1 to $1 \times 10^5$ $cm^{-2}$, and a plurality of inversion domains 1t in which the dislocation density was 0.1 to $1 \times 10^9$ $cm^{-2}$. Along one major surface of the GaN starting substrates 1, the (0001) surface (Ga-atom surface) of the matrices 1s appeared, while the (000$\bar{1}$) surface (N-atom surface) of the inversion domains 1t appeared. Furthermore, the inversion domains 1t extended from one edge to the other edge of the starting substrates 1, along their <$1\bar{1}00$> directions in a striped formation. Here, sample GaN starting substrates 1 of two kinds were prepared: Starting Substrates A, in which the pitch P of the inversion domains 1t was 1 mm and the width W thereof was 0.01 mm; and Starting Substrates B, in which the pitch of the inversion domains 1t was 0.05 mm and the width was 0.01 mm.

1-2. Growth of GaN Crystal (III-Nitride Crystal) by Na Flux Growth (Liquid-Phase Deposition)

Figure 9:
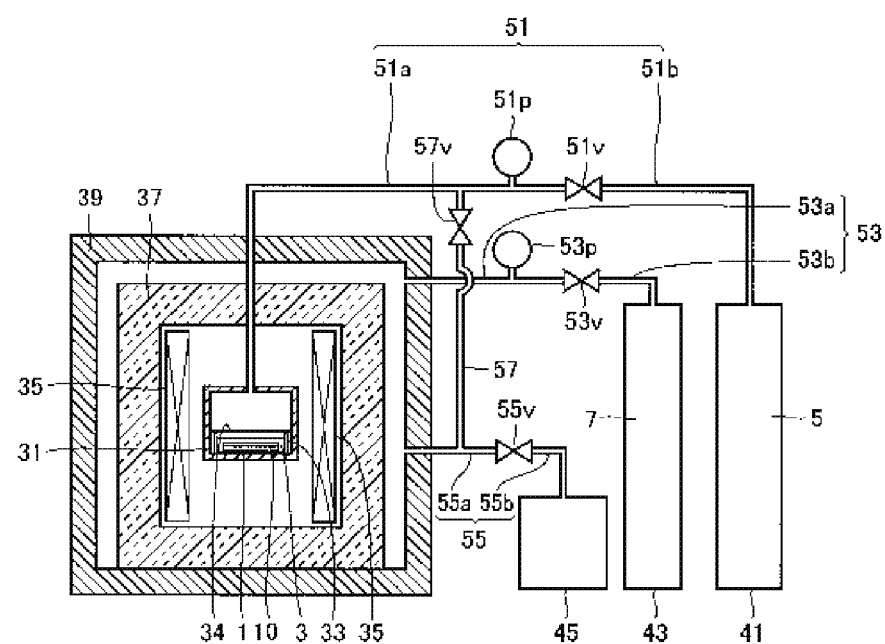
FIG. 9 is a schematic diagram representing one example of an apparatus, utilized in the present invention, for liquid-phase deposition of III-nitride crystal.

With reference to FIG. 3B and FIG. 9, GaN crystal (III-nitride crystal 10) was grown in the following manner by the Na flux method onto the two types of GaN starting substrate 1 just described—Starting Substrates A and Starting Substrates B.

Referring to FIG. 9, a crystal-growth reactor employed in growing the III-nitride crystal by the Na-flux method is furnished with, for example: an outer chamber 39; a thermally insulating component 37 disposed in the inside of the outer chamber 39; a heater 35 disposed in the inside of the insulating component 37; and an inner chamber 31 disposed inward of the heater 35. A crystal-growth vessel 33 for growing within it the III-nitride crystal 10 is disposed inside the inner chamber 31. Further, the opening in the crystal-growth vessel 33 may be covered by a lid 34. Herein, while the material of the crystal-growth vessel 33 and the lid 34 is not particularly limited as long as it does not react with solvent 3 and nitrogen-containing gas 5, and is of high mechanical strength and heat resistance, a material such as BN (boron nitride) is preferable. And while the material of the inner chamber 31 is not particularly limited as long as it is of high mechanical strength and heat resistance, materials such as stainless and heat-resistant steels are preferable. Likewise, while the material of the outer chamber 39 is not particularly limited as long as it is of high mechanical strength and heat resistance, materials such as stainless steels are preferable. And while the material of the thermally insulating component 37 is not particularly limited as long as it is of high mechanical strength, heat resistance, and insulating ability, materials such as graphite wool are preferable.

The present crystal-growth reactor is also provided with: a nitrogen-containing-gas supply device 41 connected to the inner chamber 31 by a first supply line 51; a pressurizing gas supply device 43 connected to the outer chamber 39 by a second supply line 53; and a evacuation pump 45 connected to the outer chamber 39 by a third supply line 55. The first supply line 51 herein is furnished with a valve 51v for adjusting the supply flow volume of the nitrogen-containing gas 5, while the supply-line section 51a to the inner chamber 31 side of the valve 51v is provided with a first pressure gauge 51p. Likewise, the second supply line 53 is furnished with a valve 53v for adjusting the supply flow volume of the pressurizing gas 7, while the supply-line section 53a to the outer chamber 39 side of the valve 53v is provided with a second pressure gauge 53p. Furthermore, the third supply line 55 is furnished with a valve 55v for adjusting the exhaust flow volume.

The growth reactor is additionally provided with a fourth supply line 57 connecting the section 51a of the first supply line 51 to the inner chamber 31 side of valve 51v with the section 55a of the third supply line 55 to the outer chamber 39 side of valve 55v. The fourth supply line 57 is provided with a valve 57v. It will be appreciated that in FIG. 9, for the sake of reference, the section 51b of the first supply line 51 to the nitrogen-containing-gas supply device 41 side of valve 51v, the section 53b of the second supply line 53 to the pressurizing-gas supplying device 43 side of valve 53v, and the section 55b of the third supply line 55 to the evacuation-pump 45 side of valve 55v are also illustrated.

Referring to FIG. 9, the above-described GaN starting substrate 1 of the two types were each placed on the bottom of a boron-nitride crucible (crystal-growth vessel 33) of 60 mm inner diameter and 20 mm depth, with the aforementioned one major surface facing up (substrate placement substep). Next, 15 g of metallic Ga of 99.9999 mol % purity, and 11 g of metallic Na (solvent 3) of 99.99 mol % purity were put into the BN crucible (crystal-growth vessel 33) into which the GaN starting substrates 1 had been placed (solvent placement substep). The metallic Ga and metallic Na (solvent 3), which are solid at room temperature (approximately 25° C.), by subsequent heating were liquefied into a metallic Ga—Na melt in which the molar ratio of metallic Ga (Group-III metal $M_{III}$) to metallic Na (alkali metal $M_A$) $M_{III}$: $M_A$=31:69, with the depth from the surface of the metallic Ga—Na melt (solvent 3) to the major surface of the GaN starting substrates 1 being 5 mm.

Next, the BN crucible (crystal-growth vessel 33) in which the GaN starting substrates, as well as the metallic Ga and metallic Na (solvent 3), had been contained was set inside the inner chamber 31. A boron-nitride lid 34 was placed on top of the BN crucible (crystal-growth vessel 33)—(crystal-growth container placement substep).

Next, a vacuum pump (the evacuation pump 45) was employed to evacuate the interior of the inner chamber 31 and outer chamber 39 (evacuation substep). The vacuum level in the inner chamber 31 and outer chamber 39 following evacuation was $1 \times 10^{-3}$ Pa.

Nitrogen-containing gas 5 and pressurizing gas 7 were then respectively supplied into interior of the inner chamber 31 and outer chamber 39 so that the internal pressure of each chamber would be 1 MPa (nitrogen-containing gas supply substep). In this process, a high-purity nitrogen gas of 99.99999 mol % purity was used for the nitrogen-containing gas 5 supplied inside the inner chamber 31. Meanwhile, nitrogen gas of 99.9999 mol % purity was used for the pressurizing gas 7 supplied to the outer chamber 39.

Next, the heater 35, which was of the resistive heating type, was employed to heat the inside of the inner chamber 31 and outer chamber 39, and bring the temperature of the inner chamber 31 interior overall to 870° C. (heating substep). This heating liquefied the metallic Ga and metallic Na (solvent 3) placed in the inner chamber 31, covering the aforementioned major surface of the GaN starting substrates 1 and dissolving the high-purity nitrogen gas (nitrogen-containing gas 5) into the liquefied metallic Ga and metallic Na, i.e., the Ga—Na melt (solvent 3). In this way, it was possible to bring the solution in which the high-purity nitrogen gas (nitrogen-containing gas 5) was dissolved into the Ga—Na melt (solvent 3) into contact with the said one major surface of the GaN substrates (starting substrates 1). During the heating, high-purity nitrogen gas (nitrogen-containing gas 5) was additionally supplied to the inner chamber 31 to make the internal pressure of the inner chamber 31 in the range of from 0.01 MPa to 0.1 MPa greater than that of the internal pressure of the outer chamber 39. That is, the pressure situation was made so that 0.01 MPa $\leq$ {(inner-chamber internal pressure)–(outer-chamber internal pressure)} $\leq$ 0.1 MPa.

Subsequently, the amount of the nitrogen-containing gas 5 supplied, and the amount of heat added, to the inner chamber 31 were adjusted to bring the internal pressure of the inner chamber 31 to 3 MPa (crystal-growth pressure) with the temperature of the inner chamber 31 interior overall being kept at 870° C. (crystal-growth temperature), and GaN crystal (III nitride crystal 10) was grown onto the said major surface of the GaN starting substrates 1 for 200 hours (crystal-growth substep). In this process, the amount of the nitrogen gas (pressurizing gas 7) supplied to the outer chamber 39 was adjusted to make the internal pressure of the outer chamber 39 in the range of from 0.01 MPa to 0.1 MPa less than that of the internal pressure of the inner chamber 31. That is, likewise as during heating, during crystal growth the pressure situation was made so that 0.01 MPa $\leq$ {(inner-chamber internal pressure)–(outer-chamber internal pressure)} $\leq$ 0.1 MPa.

Next, the interiors of both the inner chamber 31 and the outer chamber 39 were cooled and depressurized, with the relationship 0.01 MPa≦{(inner-chamber internal pressure)−(outer-chamber internal pressure)}≦0.1 MPa being maintained, and from the Ga—Na melt (solvent 3) in the BN crucible (crystal-growth vessel 33) within the inner chamber 31 having been cooled to 30° C., the GaN crystal (III nitride crystal 10) grown onto the GaN starting substrates 1 was taken out with tweezers. The thickness of the obtained GaN crystal was 200 μm. That meant that the GaN crystal-growth rate was 1 μm/hr.

In the above-described way, GaN crystal A (III-nitride crystal 10) produced on Starting Substrates A (starting substrates 1) contained low-dislocation-density regions 10k, grown onto the matrices 1s in the Starting Substrates A, and high-dislocation-density regions 10h, grown onto the buried second zones 10t, and had an average dislocation density of $5 \times 10^5$ cm$^{-2}$, with the dislocation density of the low-dislocation-density regions being 2 to $10 \times 10^4$ cm$^{-2}$ and the dislocation density of the high-dislocation-density regions being 1 to $2 \times 10^6$ cm$^{-2}$. Meanwhile, GaN crystal B (III-nitride crystal 10) produced on Starting Substrates B (starting substrates 1) formed essentially with low-dislocation-density regions 10k only, grown onto the matrices 1s in the Starting Substrates B, and had an average dislocation density of $2 \times 10^6$ cm$^{-2}$, with an essentially uniform dislocation-density profile, in that the dislocation density of the low-dislocation-density regions was within a 1.5 to $2.5 \times 10^6$ cm$^{-2}$ range. In the present application, a substrate's dislocation-density profile being "essentially uniform" means that in that substrate, the ratio of the dislocation density of the high-dislocation-density regions to the average dislocation density is less than 2, for example.

Herein, the dislocation density (dark-spot density under CL) of the substrates was calculated by determining the number of dark spots per unit area (surface area of a 100 μm×100 μm square region) where the substrate major surface was measured by CL, in 500 locations on points of a 100-μm pitch grid where the major surface intersected the high-dislocation-density regions perpendicular to their longitudinal direction.

1-3. Growth of GaN Single Crystal (III-Nitride Single Crystal) by HVPE (Vapor-Phase Deposition)

Figure 10:
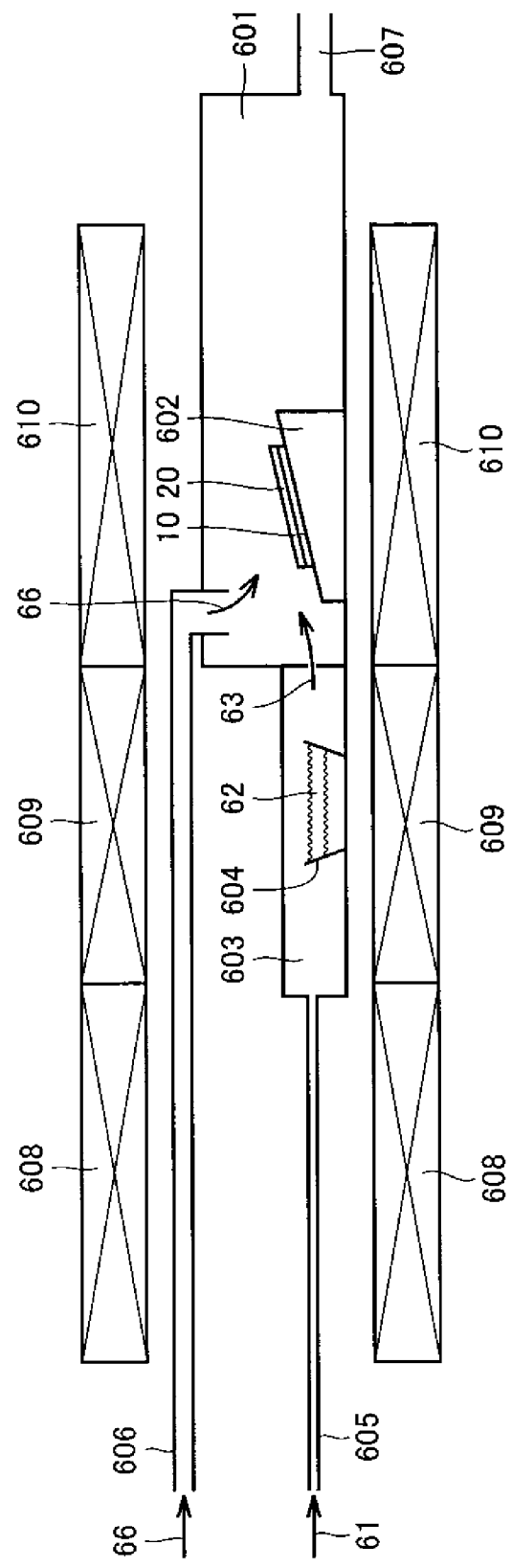
FIG. 10 is a schematic diagram representing one example of an apparatus, utilized in the present invention, for vapor-phase deposition of III-nitride crystal.

With reference to FIG. 3C and FIG. 10, III-nitride single crystal 20 was grown in the following manner by HVPE onto the aforedescribed two types of GaN crystal (III-nitride crystal 10).

Reference is made to FIG. 10: In the crystal-growth reactor employed to grow the III-nitride crystal by HVPE, exemplarily a crystal holder 602 for retaining the GaN crystal (III-nitride crystal 10) is disposed inside a reaction chamber 601; and a Group III chloride gas synthesis chamber 603 for synthesizing Group III chloride gas 63 that is introduced into the reaction chamber 601, an HCl gas introduction line 605 for introducing HCl gas 61 into the III-chloride gas synthesis chamber 603, a nitrogen precursor gas introduction line 606 for introducing nitrogen precursor gas 66 into the reaction chamber 601, and an exhaust duct 607 for exhausting the post-reaction gases are installed in the reactor. In addition, a Group III metal boat 604 into which Group IIII metal 62 is stored is disposed in the III-chloride gas synthesis chamber 603. And installed surrounding the III-chloride gas synthesis chamber 603 and the reaction chamber 601, for heating both the Group III metal boat 604 and the GaN crystal (III-nitride crystal 10), are heaters 608, 609 and 610.

With reference to FIG. 10, the Ga chloride gas (Group III chloride gas 63) that is introduced into the reaction chamber 601 is synthesized to begin with. Specifically, the Ga boat (Group III metal boat 604) disposed inside the Ga chloride synthesis chamber (III-chloride gas synthesis chamber 603) is heated with heater 609 to 800° C., HCl gas is introduced inside the Ga chloride synthesis chamber (III-chloride gas synthesis chamber 603) via the HCl gas introduction line 605, and the HCl gas 61 and the Ga (III-nitride metal 62) inside the Ga boat (Group III metal boat 604) are reacted to synthesize Ga chloride gas (Group III chloride gas 63). The HCl gas 61 in this case is introduced into the Ga chloride synthesis chamber (III-chloride gas synthesis chamber 603) together with a carrier gas such as $H_2$.

The Ga chloride gas (Group III chloride gas 63) just described and $NH_3$ gas (nitrogen precursor gas 66) were introduced into the reaction chamber 601 together with the $H_2$ gas as a carrier gas, and the Ga chloride gas (Group III chloride gas 63) and $NH_3$ gas (nitrogen precursor gas 66) were reacted over the GaN crystal (III-nitride crystal 10), placed atop the crystal holder 602 inside the reaction chamber 601 and heated to 1100° C., whereby for 50 hours single-crystal GaN was grown, yielding a 10-mm thick GaN single-crystal.

In this process, in order to enhance uniformity in the amount of Ga chloride gas (Group III chloride gas 63) and $NH_3$ gas (nitrogen precursor gas 66) supplied to the major surface of the GaN substrate during growth of the GaN single crystal (III-nitride single crystal 20), the GaN crystal (III-nitride crystal 10) was disposed atop the crystal holder 602, slanted 10° with respect to the horizontal, and rotated at a turning rate of 60 rpm. Also, the partial pressure of the Ga chloride gas (Group III chloride gas 63) was made 5.065 kPa (0.05 atm), and the partial pressure of the $NH_3$ gas (nitrogen precursor gas 66), 10.13 kPa (0.1 atm).

In the above-described way, GaN single crystal A (III-nitride single crystal 20) produced on GaN crystal A (III-nitride crystal 10) contained low-dislocation-density regions 20k, grown onto the matrices 1s in the GaN starting substrates A, and high-dislocation-density regions 20h, grown onto the buried second zones 10t, and had an average dislocation density of $3 \times 10^5$ cm$^{-2}$, with the dislocation density of the low-dislocation-density regions being 2 to $10 \times 10^4$ cm$^{-2}$ and the dislocation density of the high-dislocation-density regions being 5 to $10 \times 10^5$ cm$^{-2}$. Meanwhile, GaN single crystal B (III-nitride single crystal 20) produced on GaN crystal B (III-nitride crystal 10)—which was produced on GaN starting substrates B—formed essentially with low-dislocation-density regions 20k only, grown onto the matrices 1s in the GaN crystal B (III-nitride crystal 10), and had an average dislocation density of $3 \times 10^5$ cm$^{-2}$, with an essentially uniform dislocation-density profile, in that the dislocation density of the low-dislocation-density regions was within a 2.5 to $3.8 \times 10^5$ cm$^{-2}$ range.

1-4. Manufacture of Freestanding GaN Single-Crystal Substrates (Freestanding III-Nitride Single Crystal Substrates)

Referring to FIGS. 3C and 3D, the GaN single crystal (III-nitride single crystal 20) obtained in the manner described above was sliced along planes 20u and 20v parallel to the major surface of the starting substrate 1, yielding freestanding GaN single crystal wafers (freestanding III-nitride single crystal wafers) of 500 μm thickness. Subsequently, chemical-mechanical polishing (CMP) was employed to process the major surface of the freestanding GaN single crystal wafers (freestanding III-nitride single crystal wafers) to a specular finish, yielding a plurality of 400 μm thick freestanding GaN single crystal substrates (freestanding III-nitride single crystal substrates 20p).

2. Evaluation of Fracture Strength of Freestanding GaN Single-Crystal Substrates (Freestanding III-Nitride Single Crystal Substrates)

The plurality of freestanding GaN single crystal substrates just described was grouped into: ten substrates (Group 1) whose average dislocation density was in the range of 3 to $5 \times 10^5$ cm$^{-2}$, dislocation density of the low-dislocation-density regions, 2 to $10 \times 10^4$ cm$^{-2}$, and dislocation density of the high-dislocation-density regions, 10 to $20 \times 10^5$ cm$^{-2}$; ten substrates (Group 2) whose average dislocation density was 3 to $5 \times 10^5$ cm$^{-2}$, and having an essentially uniform dislocation-density profile (the ratio of dislocation density of the high-dislocation-density regions to the average dislocation density was less than 2); and ten substrates (Group 3) whose average dislocation density was 10 to $20 \times 10^5$ cm$^{-2}$, and having an essentially uniform dislocation-density profile. In the evaluation, the Group 1 substrates were taken as Embodiment I of the invention in the present application, while the Group 2 and Group 3 substrates were taken as Comparative Example II and Comparative Example III, respectively.

The ten freestanding GaN single crystal substrates of each group were each housed individually in a wafer tray of polypropylene for a single 2-inch wafer, and fixed with a spring. For each group of the manufactured substrates that had been housed in this way, the ten wafer trays were dropped in a freefall onto a concrete floor from a height of 50 cm. With the Group 1 substrates, among the ten there were none that fractured (Embodiments 1-1 through 1-10). With the Group 2 substrates, among the ten there were seven that fractured (Comparative Examples II-1 through II-10). With the Group 3 substrates, among the ten there were 2 that fractured (Comparative Examples III-1 through III-10). The results are tabulated in Tables I through III.

TABLE I

| Embod. I | Average dislocation density ($\times 10^5$ cm$^{-2}$) | Dislocation density of high-dislocation density regions ($\times 10^5$ cm$^{-2}$) | High disloc. density/ low disloc. density dislocation density ratio | Total no. fractured substrates, or presence of individual fractures |
|---|---|---|---|---|
| Overall | 3~5 | 10~20 | 2~6.7 | 0 substrates |
| I-1 | 3.1 | 10~20 | 3.2~6.5 | none |
| I-2 | 3.5 | 10~20 | 2.9~5.7 | none |
| I-3 | 3.6 | 10~20 | 2.8~5.6 | none |
| I-4 | 3.8 | 10~20 | 2.6~5.3 | none |
| I-5 | 3.8 | 10~20 | 2.6~5.3 | none |
| I-6 | 3.9 | 10~20 | 2.6~5.1 | none |
| I-7 | 4.1 | 10~20 | 2.4~4.9 | none |
| I-8 | 4.3 | 10~20 | 2.3~4.7 | none |
| I-9 | 4.5 | 10~20 | 2.2~4.4 | none |
| I-10 | 4.6 | 10~20 | 2.2~4.3 | none |

TABLE II

| Comp. Ex. II | Average dislocation density ($\times 10^5$ cm$^{-2}$) | Total no. fractured substrates, or presence of individual fractures |
|---|---|---|
| Overall | 3~5 | 7 substrates |
| II-1 | 3.3 | present |
| II-2 | 3.8 | present |
| II-3 | 3.9 | present |
| II-4 | 4.0 | none |
| II-5 | 4.2 | present |
| II-6 | 4.3 | present |
| II-7 | 4.4 | present |
| II-8 | 4.5 | none |
| II-9 | 4.5 | present |
| II-10 | 4.9 | none |

TABLE III

| Comp. Ex. III | Average dislocation density ($\times 10^5$ cm$^{-2}$) | Total no. fractured substrates, or presence of individual fractures |
|---|---|---|
| Overall | 10~20 | 2 substrates |
| III-1 | 10 | none |
| III-2 | 12 | none |
| III-3 | 13 | none |
| III-4 | 13 | present |
| III-5 | 15 | none |
| III-6 | 15 | none |
| III-7 | 16 | none |
| III-8 | 18 | none |
| III-9 | 19 | none |
| III-10 | 20 | present |

As is clear from Table I, contrasting Comparative Example III with Comparative Example II evidences that among the freestanding III-nitride single crystal substrates in which the dislocation-density profile is essentially uniform, compared with substrates in which the average dislocation density is a large 10 to $20 \times 10^5$ cm$^{-2}$, substrates in which the average dislocation density is a small 3 to $5 \times 10^5$ cm$^{-2}$ are fracture-prone. Contrasting Comparative Example II with Embodiment I evidences that among the freestanding III-nitride single crystal substrates in which the average dislocation density is a small 3 to $5 \times 10^5$ cm$^{-2}$, compared with substrates in which the dislocation-density profile is essentially uniform, substrates in which the dislocation-density profile is essentially non-uniform (in which ratio of the dislocation density of the high-dislocation-density regions to the average dislocation density is 2 or greater) are extremely unlikely to fracture.

3. Manufacture of Semiconductor Device

3-1. Semiconductor Device Substrate Preparation

Referring to FIG. 11, freestanding GaN single-crystal substrate I-10 (freestanding III-nitride single crystal substrate 20p) obtained in Embodiment I-10 was prepared as a semiconductor device substrate 90p.

3-2. Semiconductor Device Manufacture

Reference is made to FIG. 13: Onto a one major surface 90m (referring to FIG. 11, the major surface 90m corresponds to the major surface 20m of the freestanding III-nitride single crystal substrate 20p) of the freestanding GaN single-crystal substrate I-10 (semiconductor device substrate 90p), by MOCVD a 0.6-μm thick n$^+$-type GaN layer 72, a 7-μm thick n-type GaN layer 74 (electron density of $3 \times 10^{16}$ cm$^{-3}$), and a 0.5-μm thick p-type GaN layer 76 (Mg atom density of $7 \times 10^{17}$ cm$^{-3}$) were grown, in that order, as at least single-lamina III-nitride semiconductor layer 70. In this way a p-n junction plane 90j was formed in between the p-type GaN layer 76 and the n-type GaN layer 74. Next, an Ni layer and an Au layer were formed in that order as a p-side electrode 82, by evaporation deposition onto the p-type GaN layer 76 to create an Ni/Au laminate electrode. Then a Ti layer and an Al layer were formed in that order as an n-side electrode 84 by evaporation deposition onto the other major surface 90n (referring to FIG. 11, the major surface 90n corresponds to the major surface 20n of the freestanding III-nitride single crystal substrate 20p) of the freestanding GaN single-crystal substrate I-10 (semiconductor device substrate 90p), creating a Ti/Al laminate electrode. In this way a semiconductor device 90 was produced.

Figure 15:
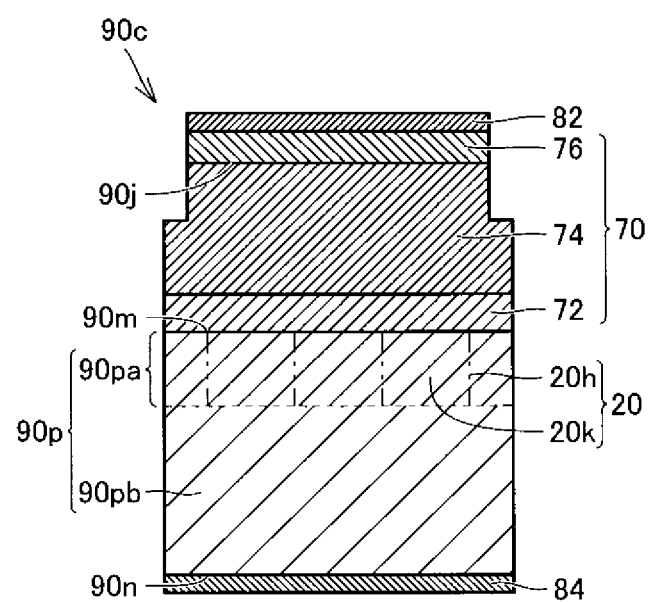
FIG. 15 is a sectional diagram summarily illustrating one example of a semiconductor device chip obtained by the semiconductor device manufacturing method involving the present invention.

Next, referring to FIGS. 14 and 15, the aforedescribed semiconductor device 90—the p-side electrode 82, p-type GaN layer 76, and a portion of the n-type GaN layer 74—was mesa-etched along its dicing streets 90d. Subsequently, by segmenting the semiconductor device 90 along the dicing streets 90d into ten chips C1 through C10 whose p-n junction plane 90j size was 1 cm×1 cm, with no fractures arising in the semiconductor device 90, ten semiconductor device chips 90c in which the p-n junction plane 90j surface area was 1 cm$^{-2}$ were obtained from the semiconductor device 90.

A reverse breakdown voltage test was conducted on the ten semiconductor device chips obtained, whereupon all ten semiconductor device chips had a reverse breakdown voltage of not less than 500 V, thus exhibiting exceedingly superior reverse breakdown voltage characteristics. Herein, a plurality of high-dislocation-density region 20h were present in the freestanding GaN single-crystal substrate I-10 (freestanding III-nitride single crystal substrate 20p) utilized as the semiconductor device substrate 90p for the semiconductor device chips 90c, extending along <1$\bar{1}$00> directions in the substrate I-10, at a pitch of 1 mm along <11$\bar{2}$0> directions in the substrate I-10. This means that the semiconductor device substrates 90p in all of the semiconductor device chips 90c contained a plurality of high-dislocation-density regions 20h and low-dislocation-density regions 20k. Accordingly, by utilizing a freestanding III-nitride single-crystal substrate in which the average dislocation density is not greater than 5×10$^5$ cm$^{-2}$, and that includes one or more high-dislocation-density regions, and a plurality of low-dislocation-density regions in which the dislocation density is lower than that of the high-dislocation-density regions, semiconductor devices with enhanced device characteristics were obtained at high yields.

The presently disclosed embodying modes and embodiment examples should in all respects be considered to be illustrative and not limiting. The scope of the present invention is set forth not by the foregoing description but by the scope of the patent claims, and is intended to include meanings equivalent to the scope of the patent claims and all modifications within the scope.

A freestanding III-nitride single crystal substrate involving the present invention is utilized in applications including light-emitting devices such as light-emitting diodes and laser diodes, in electronic devices such as rectifiers, bipolar transistors, field-effect transistors, and high electron mobility transistors (HEMTs), semiconductor sensors such as temperature sensors, pressure sensors, radiation sensors, or visible-blind ultraviolet detectors, surface acoustic wave devices (SAW devices), vibrators, resonators, oscillators, microelectromechanical system (MEMS) parts, and piezoelectric actuators.

What is claimed is:

1. A III-nitride crystal manufacturing method comprising:
a substrate-constituting step of preparing a III-nitride crystal starting substrate structured in a pattern of alternating first and second crystallographically distinct regions, by rendering the III-nitride crystal starting substrate such that the second regions are matrices and the first regions are inversion domains where <0001> directed polarity with respect to the matrices is inverted, wherein the pattern of first and second regions appears in a side of the starting substrate defining a major surface thereof; and
a growth step of growing III-nitride crystal onto the starting substrate major surface to initially create over the first regions of the starting substrate first zones having high-density dislocations, and over the second regions of the starting substrate second zones having low-density dislocations, and of continuing the III-nitride crystal manufacturing so as to cover over and bury the first zones with the second zones, such that the III-nitride crystal possesses both regions having high-density dislocations and regions having low-density dislocations, and such that the ratio of the dislocation density of the high-dislocation-density regions to the crystal's average dislocation density is 2 or greater.

2. The III-nitride crystal manufacturing method set forth in claim 1, wherein the III-nitride crystal manufacturing step includes a first substep of growing III-nitride crystal by liquid-phase deposition directly onto the starting substrate, and a second substep of growing III-nitride crystal by vapor-phase deposition onto the crystal grown in said first substep.

3. The III-nitride crystal manufacturing method set forth in claim 2, wherein the liquid-phase deposition is by Na flux growth, and the vapor-phase deposition is by hydride vapor-phase epitaxy.

4. The III-nitride crystal manufacturing method set forth in claim 1, wherein the inversion domains in the starting substrate are of width W and arranged at pitch P, with W being from 0.01 to 0.1 mm and P being from 0.1 to 30 mm.

5. The III-nitride crystal manufacturing method set forth in claim 4, wherein W is from 0.0001 to 0.01 mm, and P is from 0.01 to 0.1 mm.

6. The III-nitride crystal manufacturing method set forth in claim 1, further comprising:
a cutting step of cutting a slice off the III-nitride crystal obtained in said growth step; and
a substrate-production step of polishing the slice obtained in said cutting step to produce a III-nitride crystal substrate.

7. The III-nitride crystal manufacturing method set forth in claim 6, wherein in said cutting step the crystal is sliced along a plane parallel to the major surface of the starting substrate.

8. The III-nitride crystal manufacturing method set forth in claim 6, wherein the crystal slice is at least 100 μm in thickness.

9. A III-nitride semiconductor device manufacturing method, comprising:
i. a substrate obtaining step of obtaining a III-nitride crystal substrate of the substrate-production step of claim 6; and
ii. a step of forming an at least single-lamina III-nitride semiconductor layer onto the III-nitride substrate obtained in said substrate obtaining step, to produce a III-nitride semiconductor device.

10. A III-nitride crystal manufacturing method comprising:
a substrate-constituting step of preparing a III-nitride crystal starting substrate structured in a pattern of alternating first and second crystallographically distinct regions, by arranging a plurality of III-nitride crystal chips to form the III-nitride crystal starting substrate as an aggregate starting substrate with major surfaces of the chips paralleling each other and with lateral sides of the chips adjoining each other, wherein the chips form the starting-substrate second regions and the adjoining lateral sides of the chips form the starting-substrate first regions, and the pattern of first and second regions appears in a side of the starting substrate defining a major surface thereof; and a growth step of growing III-nitride crystal onto the starting substrate major surface to initially create over the first regions of the starting substrate first zones having high-density dislocations, and over the second regions of the starting substrate second zones having low-density dislocations, and of continuing the III-nitride crystal manufacturing so as to cover over and bury the first zones with the second zones, such that the III-nitride crystal possesses both regions having high-density dislocations and regions having low-density dislocations, and such that the ratio of the dislocation density of the high-dislocation-density regions to the crystal's average dislocation density is 2 or greater.

11. The III-nitride crystal manufacturing method set forth in claim 10, wherein the plane orientations of the major surfaces of the chips forming the III-nitride crystal aggregate starting substrate are identical or nearly identical.

12. The III-nitride crystal manufacturing method set forth in claim 10, wherein the geometry of the major surfaces of the chips forming the III-nitride crystal aggregate starting substrate is one selected from triangular, quadrangular or hexagonal.

13. The III-nitride crystal manufacturing method set forth in claim 12, wherein the geometry of the major surfaces of the chips forming the III-nitride crystal aggregate starting substrate is one selected from equilateral-triangular, square, rectangular, rhomboid, parallelogrammic, trapezoidal or regular-hexagonal.

14. The III-nitride crystal manufacturing method set forth in claim 10, wherein the plane orientations of the major surfaces of the chips forming the III-nitride crystal aggregate starting substrate are minutely displaced from each other.

15. The III-nitride crystal manufacturing method set forth in claim 14, wherein the direction of the plane-orientation displacement of the major surfaces of the chips forming the III-nitride crystal aggregate starting substrate is either along a tilt line slanted with respect to the c-axis of the chip, or along a twist line skewed around the c-axis of the chip.

16. The III-nitride crystal manufacturing method set forth in claim 14, wherein the directions of the plane-orientation displacement of the major surfaces of the adjoining III-nitride crystal chips are such that the displacements cancel each other out.

17. The III-nitride crystal manufacturing method set forth in claim 10, wherein the III-nitride crystal growth step includes a first substep of growing III-nitride crystal by liquid-phase deposition directly onto the starting substrate, and a second substep of growing III-nitride crystal by vapor-phase deposition onto the crystal grown in said first substep.

18. The III-nitride crystal manufacturing method set forth in claim 17, wherein the liquid-phase deposition is by Na flux growth, and the vapor-phase deposition is by hydride vapor-phase epitaxy.

19. The III-nitride crystal manufacturing method set forth in claim 10, further comprising:
a cutting step of cutting a slice off the III-nitride crystal obtained in said growth step; and
a substrate-production step of polishing the slice obtained in said cutting step to produce a III-nitride crystal substrate.

20. The III-nitride crystal manufacturing method set forth in claim 19, wherein in said cutting step the crystal is sliced along a plane parallel to the major surface of the starting substrate.

21. The III-nitride crystal manufacturing method set forth in claim 19, wherein the crystal slice is at least 100 µm in thickness.

22. A III-nitride semiconductor device manufacturing method, comprising:
i. a substrate obtaining step of obtaining a III-nitride crystal substrate of the substrate-production step of claim 19; and
ii. a step of forming an at least single-lamina III-nitride semiconductor layer onto the III-nitride substrate obtained in said substrate obtaining step, to produce a III-nitride semiconductor device.

* * * * *